United States Patent [19]

Tajima et al.

[11] Patent Number: 4,931,240
[45] Date of Patent: Jun. 5, 1990

[54] METHOD FOR THE PRODUCTION OF A CARBON ELECTRODE

[75] Inventors: Yoshimitsu Tajima; Motoo Mohri, both of Nara, Japan

[73] Assignee: Sharp Kabushiki Kaisha, Osaka, Japan

[21] Appl. No.: 245,772

[22] Filed: Sep. 19, 1988

[30] Foreign Application Priority Data

Sep. 19, 1987 [JP] Japan ................. 62-235704

[51] Int. Cl.$^5$ .................. B29C 43/18; B32B 31/20; C01B 31/00
[52] U.S. Cl. ................. 264/81; 264/105; 264/136; 264/257; 264/85; 427/122; 427/123; 427/126.3; 427/249; 427/250; 427/404; 427/419.2
[58] Field of Search ............ 264/29.5, 81, 105, 136, 264/257, 85; 423/449; 427/122, 123, 126.3, 249, 250, 404, 419.2

[56] References Cited

U.S. PATENT DOCUMENTS

| 3,647,511 | 3/1972 | Clark et al. ............ 427/249 X |
| 3,895,084 | 7/1975 | Bauer ................. 264/81 X |
| 3,944,686 | 3/1976 | Froberg ............... 427/249 X |
| 3,949,106 | 4/1976 | Araki et al. ........... 427/249 |
| 4,178,413 | 12/1979 | DeMunda ............. 427/249 X |
| 4,318,948 | 3/1982 | Hodgson .............. 264/29.5 X |
| 4,396,663 | 8/1983 | Mitchell et al. ........ 264/29.5 X |

FOREIGN PATENT DOCUMENTS 2402890 8/1974 Fed. Rep. of Germany .
1163979 9/1969 United Kingdom .......... 264/81

Primary Examiner—Jeffery Thurlow
Assistant Examiner—Leo B. Tentoni
Attorney, Agent, or Firm—Birch, Stewart, Kolasch & Birch

[57] ABSTRACT

A method for the production of a carbon electrode includes directly depositing a carbon material on an electroconductive and flexible electrode substrate by chemical vapor deposition using gaseous hydrocarbons as a starting material, filling the carbon material directly deposited on the electrode substrate with a charge carrier material capable of being reversibly intercalcated therein and deintercalated therefrom, and compressing the electrode substrate filled with the charge carrier material, resulting in a thin plate-shaped carbon electrode.

14 Claims, 1 Drawing Sheet

METHOD FOR THE PRODUCTION OF A CARBON ELECTRODE

BACKGROUND OF THE INVENTION

1. Field of the Invention

This invention relates to a method for the production of a carbon electrode that is useful for thin-type batteries suitable as the power supply of various electronic equipment intended to be miniaturized and made thin. More particularly, it relates to a method for the production of a carbon electrode without electrochemical treatment before fabricating the battery.

2. Description of the Prior Art

For conventional batteries for electronic equipment, a battery structure is widely used wherein an electroconductive material and a binding agent are admixed with an electrode active material, the mixture is coated on a current-collector such as a metal net so as to form an electrode, and another electrode is disposed opposite so as to interpose a separator between these electrodes.

However, the electrode manufactured by the above-mentioned method is disadvantageous in that electric contact of the electrode active material with the electroconductive material or the current-collector is poor, resulting in a large internal resistance of the battery that uses the electrode. Moreover, the electroconductive material and the binding agent are required in addition to the electrode active material, therefore resulting in a decrease in the amount of electrode active material, which induces a decrease in energy density. Also, it is necessary that the resulting electrode is treated electrochemically in an electrolytic solution before fabricating the battery, which causes complication of the manufacturing process.

SUMMARY OF THE INVENTION

The method for the production of a carbon electrode of this invention, which overcomes the above-discussed and numerous other disadvantages and deficiencies of the prior art, comprises directly depositing a carbon material on an electroconductive and flexible electrode substrate by chemical vapor deposition using gaseous hydrocarbons and/or their derivatives as a starting material, filling the carbon material directly deposited on the electrode substrate with a charge carrier material capable of being reversibly intercalated therein or deintercalated therefrom, and compressing the electrode substrate filled with the charge carrier material, resulting in a thin plate-shaped carbon electrode.

In a preferred embodiment, the electrode substrate is an electroconductive and three-dimensionally structured substance.

In a preferred embodiment, the charge carrier material is an electron-donating substance such as alkaline metals, alkaline earth metals, rare earth metals, or the like.

In a preferred embodiment, the charge carrier material is an electron-accepting substance such as halogens, halogen compounds, metal oxides, oxo acids, hydrides, or the like.

Thus, the invention described herein makes possible the objectives of (1) providing a method for the production of a carbon electrode in which a decrease in the battery's capacity caused by poor electric contact of the electrode active material with the electroconductive material or the current-collector can be avoided; (2) providing a method for the production of a carbon electrode in which the carbon material as an active material is directly deposited on an electrode substrate by chemical vapor deposition and compressed, thereby producing an electrode with high energy density without the use of binding agents; (3) providing a method for the production of a carbon electrode that is suitable as an electrode for batteries without electrochemical treatment before fabricating the battery, thereby simplifying the production process of the battery and allowing a lower production cost; and (4) providing a method for the production of a carbon electrode in which the carbon material as an active material is directly deposited on an electrode substrate and compressed so that the density of the carbon material can be increased, resulting in an electrode for batteries with excellent charge-discharge cycle characteristics and high energy density.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
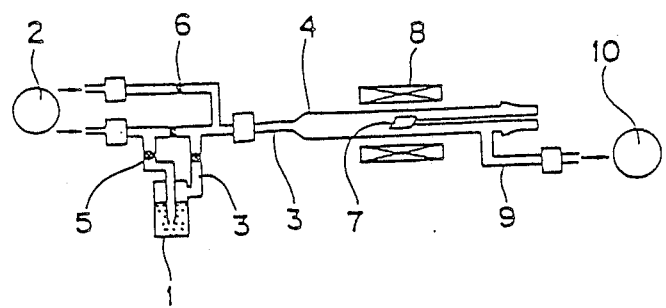
FIG. 1 is a schematic diagram showing an apparatus for the deposition of a carbon material that is used in the method for the production of a carbon electrode of this invention.

The electrode substrate on which a carbon active material is deposited by chemical vapor deposition is a three-dimensionally structured substance, which can be of any form such as that of a foam (i.e., sponge), wool, woven-cloth, nonwoven-cloth, net, etc., but must have flexibility so as to change its shape when compressed externally, and have electroconductivity. As the three-dimensionally structured substance, a substance can also be used that has a surface coated with an electroconductive material.

The carbon materials of this invention are deposited on an appropriate substrate by chemical vapor deposition at low temperatures using gaseous hydrocarbons as a starting material. As the hydrocarbons, aliphatic hydrocarbons, aromatic hydrocarbons, alicyclic hydrocarbons, and the like can be used. These hydrocarbons can contain various heteroatoms such as nitrogen, oxygen, etc., and/or can have substituents, examples of which are halogen, hydroxyl groups, sulfo groups, nitro groups, nitroso groups, amino groups, azo groups, carboxy groups, etc. Although the concentration of hydrocarbon compounds and temperature in the atmosphere to be thermally decomposed depend upon the kind of starting hydrocarbon compounds, they are usually set to be several millimolar percent and about 1000° C., respectively. A typical method for the vaporization of hydrocarbons is the bubbling method in which argon gas is used as a carrier gas. The hydrocarbon compound can also be vaporized by the bubbling method in which other kinds of gases are used as a carrier gas, or by evaporation, sublimation, etc. The vaporized hydrocarbon compound is supplied to a chemical vapor deposition chamber and thermally decomposed therein.

In this way, the carbon material that is an electrode active material is directly deposited on the three-dimensionally structured substrate, resulting in an electrode substance. The carbon material deposited on the substrate is then filled with a charge carrier material capable of being reversibly intercalated therein or deintercalated therefrom. As the charge carrier material, there can be used an electron-donating substance such as alkali metals, alkaline earth metals, rare earth metals, etc., or an electron-accepting substance such as halogens, halogen compounds, metal oxides, oxo acids, hydrides, etc. The charge carrier material can be of any form such as powder form, flake form, liquid, sol, gel, etc.

The electrode substance which is mentioned above is then formed by the application of an external pressure thereto. Preferably, the electrode substance is compressed by means of rollers, but it can also be compressed by a press-forming machine or other pressing means. The degree of compression can be controlled within the thickness to which the three-dimensionally structured substance can be compressed, so that it is possible to obtain a carbon electrode with a desired thickness in these ranges.

The resulting thin plate-shaped carbon electrode is constituted of an electrode substrate with a high density, which is obtained by compressing the electroconductive and flexible three-dimensionally structured substance, and a compressed carbon material film with a high density, which is directly deposited on the three-dimensionally structured substrate and filled with a charge carrier material before being compressed. The carbon electrode is cut to a desirable size and each piece is used as an electrode for batteries, particularly thin-type batteries. This carbon electrode can be used as a positive electrode and/or a negative electrode depending upon the kind of charge carrier material.

The carbon electrode of this invention can be used as an electrode of various batteries, e.g., batteries using nonaqueous electrolytic solutions, batteries using nonaqueous solid electrolytes, batteries using aqueous electrolytic solutions such as alkaline batteries and acid batteries, fuel batteries, and the like.

EXAMPLE

The carbon material (i.e., an electrode active material) was directly deposited on the electrode substrate using a reaction apparatus shown in FIG. 1, as follows: To a vessel 1 that contained benzene that had been dehydrated and refined by vacuum distillation, argon gas was supplied from an argon gas supplier 2 so as to bubble the benzene. Then, the benzene was supplied to a quartz reaction tube 4 through a Pyrex glass tube 3. At this time, the vessel 1 was heated to compensate the heat used for the evaporation of the benzene, so that the liquid benzene in the vessel 1 could be maintained at a constant temperature: the flow rate of the argon gas was controlled by valves 5 and 6 so that the amount of benzene to be supplied into the reaction tube 4 could be controlled. In the reaction tube 4, there was provided a sample holder 7 on which a three-dimensionally structured substrate (the thickness thereof being about 1.5 mm) made of foamed nickel was placed. There was a furnace 8 surrounding the outside of the reaction tube 4. This furnace 8 kept the holder 7 and the three-dimensionally structured substrate on the holder at about 1000° C. After benzene was supplied into the reaction tube 4 through the Pyrex glass tube 3, the benzene was thermally decomposed within the reaction tube 4. The benzene was thermally decomposed to be deposited as a carbon material on the whole area of the three-dimensionally structured substrate for about 60 minutes. The gas remaining in the reaction tube 4 after the thermal decomposition was removed via exhaust systems 9 and 10.

Figure 2:
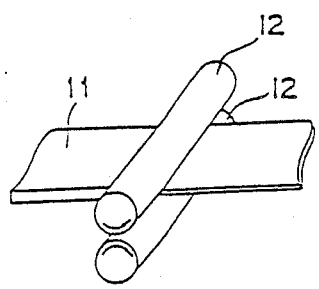
FIG. 2 is a perspective view showing a rolling process by which a three-dimensionally structured substance coated with the carbon material is rolled.

The three-dimensionally structured substrate on which the carbon material was directly deposited as described above was filled with a stoichiometric amount of lithium powder (the particle size thereof being 140 mesh), resulting in an electrode substance. As shown in FIG. 2, the electrode substance 11 was then compressed by roller 12, resulting in a carbon electrode with a thickness of 0.2 mm. The amount of lithium powder filled in the three-dimensionally structured substance was set to that particular amount of lithium powder capable of being absorbed by the carbon material. Therefore, after the electrode formation described below, unreacted lithium powder was not present.

The thin plate-shaped carbon electrode that was obtained as described above was immersed in an electrolytic cell that contained a solution of propylene carbonate containing 1M lithium perchlorate, and the carbon material deposited on the electrode substrate was allowed to absorb the lithium powder. The electrode that was formed in this way was taken out of the electrolytic cell and, after removal of the electrolytic solution therefrom, cut into pieces of a predetermined shape, resulting in a carbon electrode of this invention.

When the carbon electrode was immersed in a solution of propylene carbonate containing 1M lithium perchlorate as an electrolyte and left overnight, the electric potential of 30 millivolts was obtained with respect to the lithium electrode. When this electrode was discharged up to 2.5 volts with respect to the lithium electrode, the discharge capacity density of 320 mA·h per gram of the carbon material was obtained. These results indicate that the carbon electrode of this invention efficiently abosorbed the lithium powder. In addition, when the carbon electrode was repeatedly charged down to a potential of zero volts with respect to the lithium electrode and then discharged up to 2.5 volts, the discharging capacity showed almost no decrease after more than 200 charge-discharge cycles.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the production of a carbon electrode comprising:
   directly depositing a carbon material on an electroconductive electrode substrate by chemical vapor deposition using gaseous hydrocarbons as a starting material,
   filling said carbon material directly deposited on said electrode substrate with a charge carrier material capable of being reversibly intercalated therein and deintercalated therefrom, and
   compressing said electrode substrate filled with the charge carrier material, to produce a thin plate-shaped carbon electrode.

2. A method for the production of a carbon electrode according to claim 1, wherein said electrode substrate is a three-dimensionally structured substance.

3. A method for the production of a carbon electrode according to claim 1, wherein said charge carrier material is an electron-donating substance selected from the group consisting of alkali metals, alkaline earth metals, and rare earth metals.

4. A method for the production of a carbon electrode according to claim 1, wherein said charge carrier material is an electron-accepting substance selected from the group consisting of halogens, halogen compounds, metal oxides, oxo acids, and hydrides.

5. A method for the production of a carbon electrode according to claim 2, wherein said charge carrier material is an electron-donating substance selected from the group consisting of alkali metals, alkaline earth metals, and rare earth metals.

6. A method for the production of a carbon electrode according to claim 5, wherein said charge carrier material is an electron-accepting substance selected from the group consisting of halogens, halogen compounds, metal oxides, oxo acids, and hydrides.

7. A method for the production of a carbon electrode according to claim 1, wherein said electrode substrate is a substance selected from the group consisting of foam, sponge, wool, woven-cloth, nonwoven-cloth and net.

8. A method for the production of a carbon electrode according to claim 1, wherein said gaseous hydrocarbons are selected from the group consisting of aliphatic hydrocarbons, aromatic hydrocarbons and alicyclic hydrocarbons.

9. A method for the production of a carbon electrode according to claim 1, wherein said gaseous hydrocarbons are hydrocarbons having a substituent selected from the group consisting of nitrogen, oxygen, halogen, hydroxyl group, sulfo group, nitro group, nitroso group, amino group, azo group and carboxy group.

10. A method for the production of a carbon electrode according to claim 1, wherein said chemical vapor deposition is conducted by using argon as a carrier gas.

11. A method for the production of a carbon electrode according to claim 1, wherein said electrode substrate filled with the charge carrier material is compressed by means of rollers.

12. A method for the production of a carbon electrode according to claim 1, wherein said electrode substrate filled with the charge carrier material is compressed by a press-forming machine.

13. A method for the production of a carbon electrode according to claim 6, wherein said gaseous hydrocarbons are selected from the group consisting of aliphatic hydrocarbons, aromatic hydrocarbons and alicyclic hydrocarbons.

14. A method for the production of a carbon electrode according to claim 13, wherein said gaseous hydrocarbon is benzene.

* * * * *